(12) United States Patent
Rebstock

(10) Patent No.: US 9,122,272 B2
(45) Date of Patent: Sep. 1, 2015

(54) REDUNDANTABLE ROBOT ASSEMBLY FOR WORKPIECE TRANSFER

(75) Inventor: Lutz Rebstock, Gaienhofen (DE)

(73) Assignee: Dynamic Micro Systems, Radolfzell (DE)

( * ) Notice: Subject to any disclaimer, the term of this patent is extended or adjusted under 35 U.S.C. 154(b) by 2533 days.

(21) Appl. No.: 11/881,089

(22) Filed: Jul. 25, 2007

(65) Prior Publication Data
US 2008/0086237 A1    Apr. 10, 2008

Related U.S. Application Data

(60) Provisional application No. 60/849,997, filed on Oct. 6, 2006.

(51) Int. Cl.
*G05B 19/418* (2006.01)
*H01L 21/677* (2006.01)

(52) U.S. Cl.
CPC ...... *G05B 19/4189* (2013.01); *H01L 21/67742* (2013.01); *G05B 2219/40367* (2013.01)

(58) Field of Classification Search
CPC ...... B25J 9/1674; B25J 9/0084; B25J 9/0087; B25J 9/0096; B25J 9/04; B25J 9/06; B25J 9/16; B25J 9/1628; B25J 9/1656; B25J 9/1679; H01L 21/67769; G05D 1/0227
USPC .......................................... 700/248, 258, 250
See application file for complete search history.

(56) References Cited

U.S. PATENT DOCUMENTS

| 5,019,762 A * | 5/1991 | Kato .............................. 700/247 |
| 2004/0105737 A1 * | 6/2004 | Ozawa et al. ................. 414/217 |
| 2006/0182535 A1 | 8/2006 | Rice et al. |
| 2006/0182539 A1 | 8/2006 | Ozawa et al. |

FOREIGN PATENT DOCUMENTS

| WO | WO-98/02911 | 1/1998 |
| WO | WO-99/18603 | 4/1999 |
| WO | WO-2005/048313 | 5/2005 |

OTHER PUBLICATIONS

PCT preliminary report on patentability—PCT/IB2007/053970—dated Apr. 16, 2009.
PCT search report and written opinion—PCT/IB2007/053970—dated May 15, 2008.

* cited by examiner

*Primary Examiner* — John Q Nguyen
*Assistant Examiner* — Kyung Kim

(57) ABSTRACT

A redundantable robotic mechanism is disclosed for improving reliability of transport equipment. The redundantable robot assembly typically comprises independent robots with separate controls, motors, linkage arms, or power, thus providing the capability of operation even if parts of the assembly are not operational or when parts of the assembly are removed for repair. The redundantable robot assembly can be also designed to allow in-situ servicing, e.g. servicing one robot when the other is running. The disclosed redundantable robot assembly provides virtual uninterrupted process flow, and thus greatly increases the yield for the manufacturing facility.

14 Claims, 19 Drawing Sheets

REDUNDANTABLE ROBOT ASSEMBLY FOR WORKPIECE TRANSFER

This application claims priority from U.S. provisional patent application Ser. No. 60/849,997, filed on Oct. 6, 2006, entitled "Redundantable robot assembly for workpiece transfer"; which is incorporated herein by reference.

FIELD OF THE INVENTION

The present invention relates to apparatuses and methods to transfer objects, and more particularly to multiple independent robot assembly for reliably moving multiple workpieces, such as semiconductor wafers or reticles.

BACKGROUND

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any workpiece processing system.

Another type of equipment is supplemental equipment such as a stocker, designed for storing the workpieces until needed, or a sorter, designed for sorting the workpieces into certain desirable order. In a typical bare stocker system, a robot is typically used to remove the workpieces from the carrier boxes, and then loaded into a loadlock. Another robot can be used to move the workpiece from the loadlock into a storage chamber, where the workpieces are stored without the original carrier boxes. For box stocker system, the workpieces are stored together with the carrier boxes, without the need for removing them out of the carrier boxes.

Robot handling can be considered overhead operation, since the purpose of robot handling is to transport the workpieces between locations. Thus to improve the efficiency of the fabrication facility and to improve the throughput of the equipment, faster movement of robots, and multiple robot assemblies can be used. Thus some equipments provide a robot assembly with multiple carrier arms, to allow the transfer of multiple workpieces. The multiple carrier arms are typically not independent, and thus maximum efficiency cannot be realized. Another robot configuration includes multiple independent robot arms which can move independently, and thus can essentially double the throughput with one robot. Still another robot configuration includes two separate robots to transport the wafers for an ion implantation system.

Robot is an integral part of many equipments, which provides the most movement within the equipment, thus is prone for failure, especially with the drive for faster robots. The equipment can be down and the facility stops with a simple failure in the robot assembly.

SUMMARY

The present invention discloses apparatuses and methods for improving reliability of equipment using redundantable robotic mechanism. In one embodiment, the present invention discloses a redundantable robot assembly for certain critical operations of the equipment. In one aspect, the components of the redundantable robot assembly are redundant, i.e. the assembly still operates even with the failure of many components. In another aspect, the redundant components of the assembly contribute to the normal operations.

In one embodiment, the redundantable robot assembly is designed for optimum usage of the whole assembly during operating conditions. The redundant parts of the redundantable robot assembly are designed to operate under normal operating conditions. Thus when parts fail, the redundantable robot assembly will still operate, but under sub-optimum conditions. For example, a two-robot redundantable robot assembly according to the present invention can process 100 wafers per hour under normal operating conditions. If a robot fails, the assembly still operates, but with only one robot, and therefore the throughput is reduced to 50 wafers per hour. In other aspect, the redundantable robot assembly is designed for partially redundant components where the assembly is operating at sub-capacity.

In one embodiment, the redundantable robot assembly comprises independent robots with separate controls, motors, linkage arms, or power. In other aspect, the redundantable robot assembly can comprise multiple independent, separate robots which can operate even if parts of the assembly are not operational or when parts of the assembly are removed for repair.

In other embodiment, the redundantable robot assembly is designed to allow servicing parts of the assembly when the other parts are operating. In one aspect, the inoperative parts can be serviced, repaired or replaced at the original location. In other aspect, the redundantable robot assembly comprises removal mechanism to move the inoperative parts out of the way for repair or replacement. The movement of inoperative parts can be automatically or manually. In either case, the operation of the remaining robot assembly should be minimally affected during the servicing operation.

In other embodiment, the present invention provides a seamless operation when an inoperative part of the assembly is detected. The robot operations bypass the inoperative part, and switch the transport movement to the operative parts. In one aspect, the redundantable robot assembly provides movements of the remaining operative parts around the inoperative parts, as not to let the inoperative parts blocking the overall operations of the assembly. In other aspect, when the inoperative parts are repaired and ready to resume operation, the assembly can seamlessly transfer the operations to the newly repaired parts. The assembly can also wait for an appropriate moment, such as after a workpiece completion, or a lot completion before incorporating the repaired part into the normal operations.

In another embodiment, the present invention discloses a redundantable robot assembly having two (or more) independent robots, designed and positioned to provide essentially the same transport operations to the workpieces. In certain aspects, design trade off can be considered between design complexity and blind spots for robot reach. The robots can be position side by side, top by bottom, offset, or any other configurations. The robots can have articulate linkage arms, and each robot can also have multiple dependent or independent arms. The robots can provide radial, rotational and vertical motions, or can provides virtually any movements, such as a 6-axis robots.

In another embodiment, the present invention discloses a redundantable robot assembly having a plurality of sensors to detect the operative parts and the inoperative parts of the assembly. When an inoperative part is detected, the assembly switches operations, allowing seamless operation of the equipment with minimum down time. When the inoperative part is operative again, the assembly automatically switches back operations, including calibration before operation.

In other embodiment, the present invention discloses software instructions to operate a redundantable robot assembly. In one aspect, the robots in the redundantable robot assembly can operate independently. In other aspect, the operating instructions of the redundantable robot assembly provide instructions to operate parts of the robot assembly to accommodate the other inoperative parts, or operating instructions to calibrate the parts after being serviced, e.g. repaired, or replaced. The operator can be notified of the failure of parts of the assembly. The operating instructions can also provide an ejection operation to move the inoperative parts of the redundantable robot assembly out of the operation range for ease of repair. The operating instructions can also provide the merging of the repaired parts back into operation with minimum disruption of the robot assembly.

In one embodiment, the present invention is used in atmospheric environment to facilitate the in-situ repair of inoperative parts. In another embodiment, the present invention can be used in sub-atmospheric environment. The sub-atmospheric operation preferably includes a provision, such as a loadlock, to move the inoperative parts to an atmospheric environment for repair operation.

The present invention redundantable robot assembly can be used in stocker equipment, such as a wafer stocker, a LCD stocker, or a reticle stocker. It can also be used in processing equipment such as deposition, etching, track, lithography exposure, developer, and bake. It can also be used in transport workpieces from a loadlock to a buffer, or to a process chamber, to a storage chamber, or to a sorter chamber. It can also be used in Front End loader, to transfer workpieces from FOUPs to loadlocks.

BRIEF DESCRIPTIONS OF THE DRAWINGS

FIG. 10A shows an operating configuration, and FIG. 10B shows a configuration where the right robot is moved for servicing.

FIG. 11A shows an operating configuration, and FIG. 11B shows a configuration where the right robot is moved for servicing.

DETAIL DESCRIPTIONS

The present invention relates to an apparatus and method for improving reliability with moving equipment. The present invention involves a redundancy of the failure-prone parts, e.g. transferred robots, in an equipment to ensure continuous flow of workpieces for a fabrication facility. An exemplary redundancy of the robot assembly in an equipment comprises the duplicate of the robots, plus the redundancy abilities such as the ability to operate one robot when the other is broken, the ability of in-situ servicing the broken robot, the ability to calibrate the repaired robot, and the ability to return the repaired robot back into operation. Operation of the robot assembly includes tolerance on the position of the robot arms, to prevent hitting the other parts of the assembly, especially when the other parts are not operative, and thus cannot move out of the way.

During the processing of semiconductor workpieces in the manufacture of microelectronics, different equipments are employed for several hundred processing steps. The process flow of a workpiece is essential serial, with most of the tools operate on the workpieces one at a time. The failure of any link in the fabrication process would severely disrupt the process flow, resulting in loss of manufacturing productivity. The present invention provides the handling or movement of workpieces in a manner which assured a continuous flow of workpieces within an equipment and within a fabrication facility, even in the event of part failures. The present invention discloses a redundancy mechanism for prevent equipment failure from affecting the process flow, by allowing the equipment to be functioned, and by allowing the in-situ servicing of the failure parts.

The present invention thus provides, in an exemplary embodiment, multiple transport mechanisms, such as a plurality of robots, to perform essentially the same operations of moving workpieces. A station, such as a wafer or reticle stocker station, is centrally served by a pair of robots or workpiece transport mechanisms. Each transport is capable of axial motion along a member and pivotal or articulated motion of an arm. The axial motion is used to move workpieces between the stations and the carrier residing in a load lock, and the articulated arm is used for more constrained motions within the stations, such as swinging between stations.

Figure 1A:
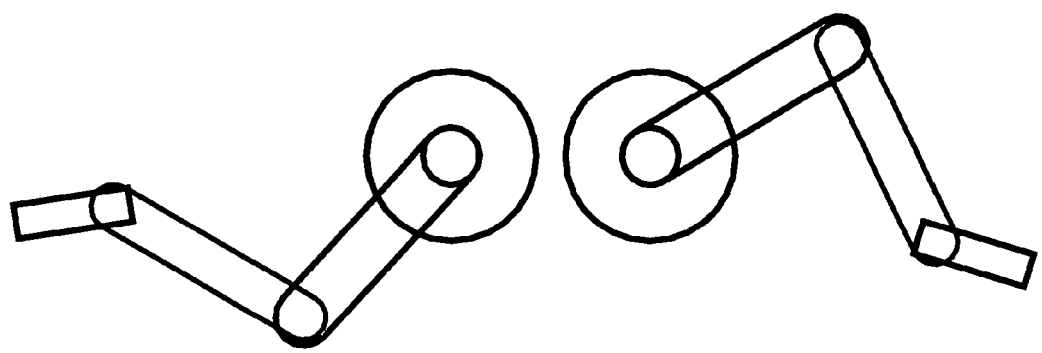
FIG. 1A shows a top view of an exemplary redundantable robot assembly according to the present invention, comprising two robots positioned side by side.
Figure 1B:
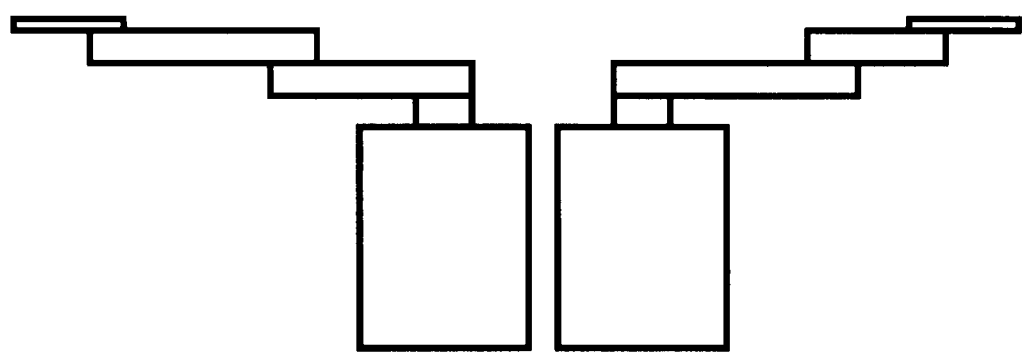
FIG. 1B shows a side view, respectively, of an exemplary redundantable robot assembly according to the present invention, comprising two robots positioned side by side.

FIG. 1A and FIG. 1B show a top view and a side view, respectively, of an exemplary redundantable robot assembly according to the present invention. The robot assembly comprises two independent robots, located side by side. The robots as shown comprise a plurality of articulate joint arms, with a single blade end effector at the end. In other embodiment, an exemplary robot can include the linear r movement, e.g. extending and retracting, to receive a workpiece, the rotation theta movement of the articulate arm, and the vertical z movement of raising or lowering the workpieces. The robots can include several different mechanisms to perform the movement of the workpieces, such as linear track, multi-segmented articulated arms, frog arms, swivel arms, scissors and telescopic mechanism, four-bar linkage mechanism. The robot arm can comprise an end effector to receive a workpiece, such as using gravitation force, or edge grip force. The end effector might be single blade of double blade. The robot's movements, such as a combination of linear and rotational motions, are typically designed to avoid high accelerations.

The transport mechanism includes a plurality of hands which are driven independently of each other. Thus the robot arm has high degree of freedom in movement, and can be able to reach many places. The robot can have double end effector. The arms of the transport mechanisms may each have a fork-like tip. The operations of the redundantable robot assembly are controlled by a computer system.

A robot arm having the ability to handle two workpieces at the same time can be used to increase the efficiency of robot handling. The robot can have two carrier arms located at opposed ends of a support, which rotates about a pivot. Another robot configuration includes a central hub having two opposed arms, with a blade linked to the free ends of the arms. A second pair of arms can extend opposed from the first pair, and thus the opposed rotation of the arms in one direction extends the first arm while retracting the second arm. The arm can use two blades to increases throughput. Another robot configuration includes a multiple robot assembly including co-axial upper and lower robot assemblies, which operate independently of each other. The upper robot is typically stacked above the lower robot and the two robots may be mounted concentrically. The robot assembly can be constructed with motors such as servo motors with a synchronous device.

Figure 2A:
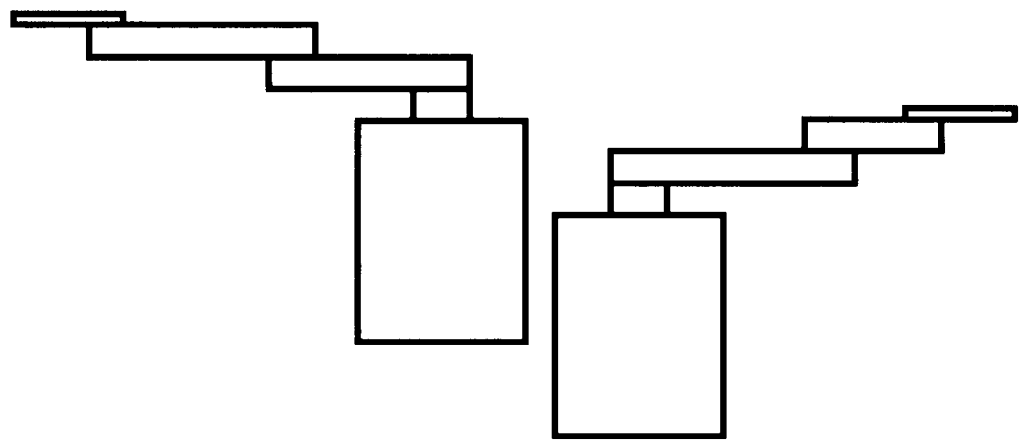
FIG. 2A shows a configuration of two robot assemblies according to an embodiment of the present invention, comprising two robots positioned side by side with offset.
Figure 2B:
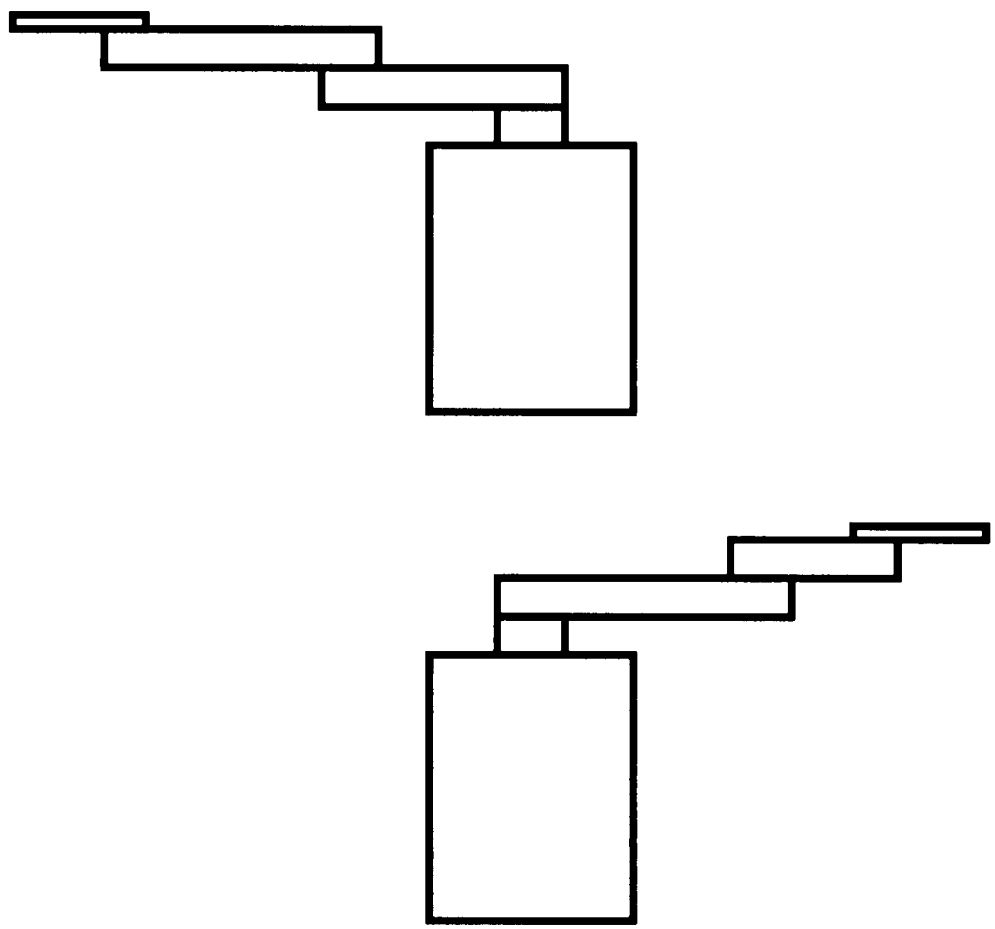
FIG. 2B shows a configuration of two robot assemblies according to an embodiment of the present invention, comprising two robots positioned on top of each other.
Figure 2C:
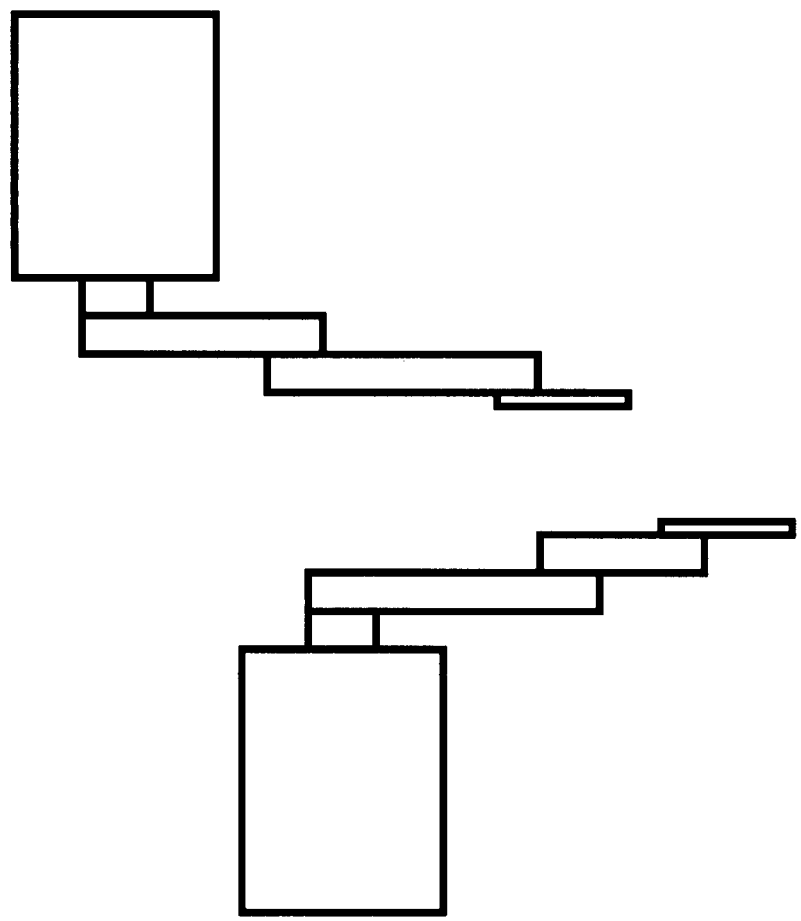
FIG. 2C shows a configuration of two robot assemblies according to an embodiment of the present invention, comprising two robots positioned on top of each other, also inverted with offset.

FIGS. 2A-2C show various configurations of two robot assembly according to embodiments of the present invention. The two robots can be positioned side by side with offset, as shown in FIG. 2A. The two robots can be positioned on top of each other, as shown in FIG. 2B, or inverted with offset as shown in FIG. 2C. The particular positions of the robots depend on the system requirements.

Figure 3:
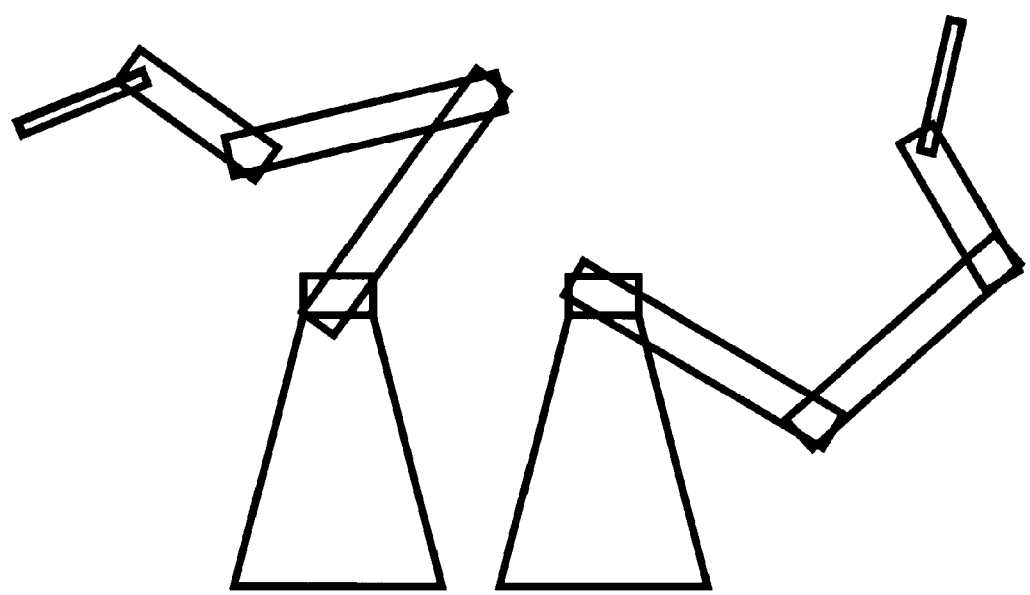
FIG. 3 shows a configuration of two robot assembly according to an embodiment of the present invention, comprising two robots having 4 arm segments with multiple degrees of freedom.

FIG. 3 shows an exemplary configuration for two robots with 4 arm segments and multiple degrees of freedom at each joint. The robot arm can move virtually in all directions with no constraints of r, theta and z as in linear arms.

Figure 4:
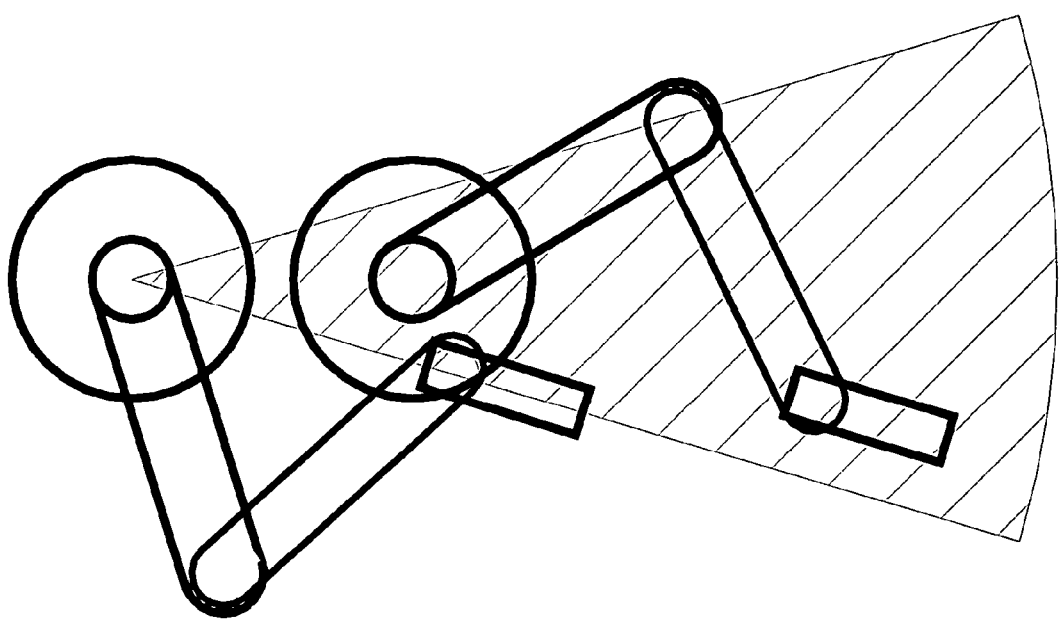
FIG. 4 shows a configuration of two robot assembly where there is a blind area where a robot cannot reach if no rotational movement is permitted after radial movement.
Figure 5:
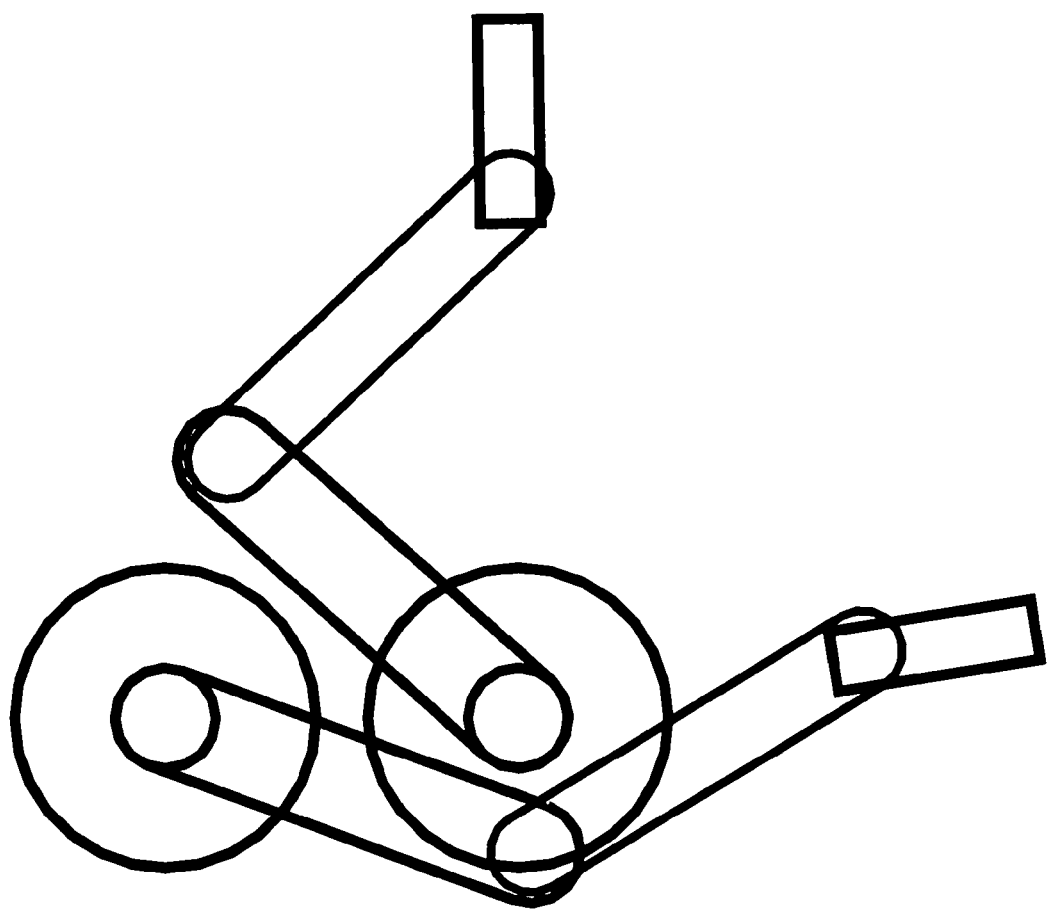
FIG. 5 shows a configuration of two robot assembly where the blind area is eliminated if rotational movement is permitted after radial movement.

FIG. 4 shows an exemplary configuration of redundantable robot assembly with the robot having 3 articulate joint arms. If rotational can only performed before radial movement, the arm of one robot might have a blind area (cross hatched area) where the left robot cannot reach. If rotational movement is allowed after radial movement, it can reach the blind area as shown in FIG. 5. The robot can have only one motor control for the first arm, with the second arm depending on the movement of the first arm. The robot can also have two motor controls, one for rotating the first arm, and one for rotating the second arm. The second arm in this case can move independent of the first arm.

Figure 6:
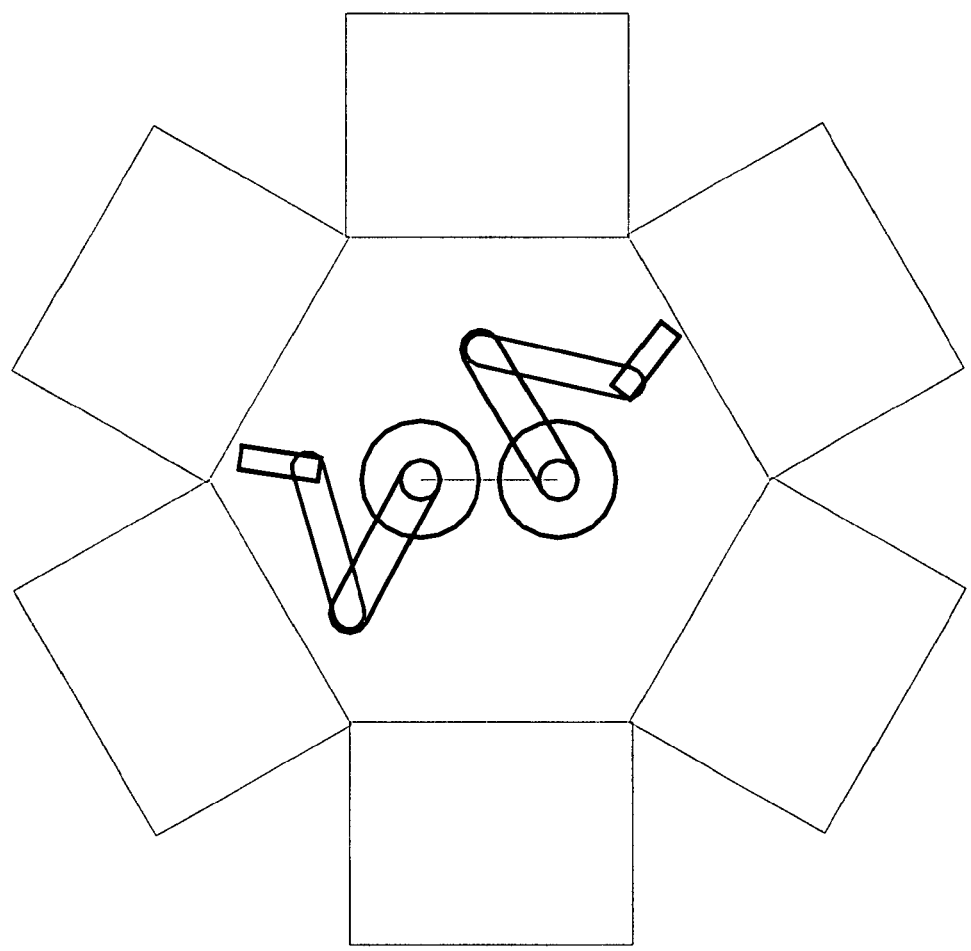
FIG. 6 shows a configuration of two robot assembly in application to a concentric array of workpiece stations.
Figure 7:
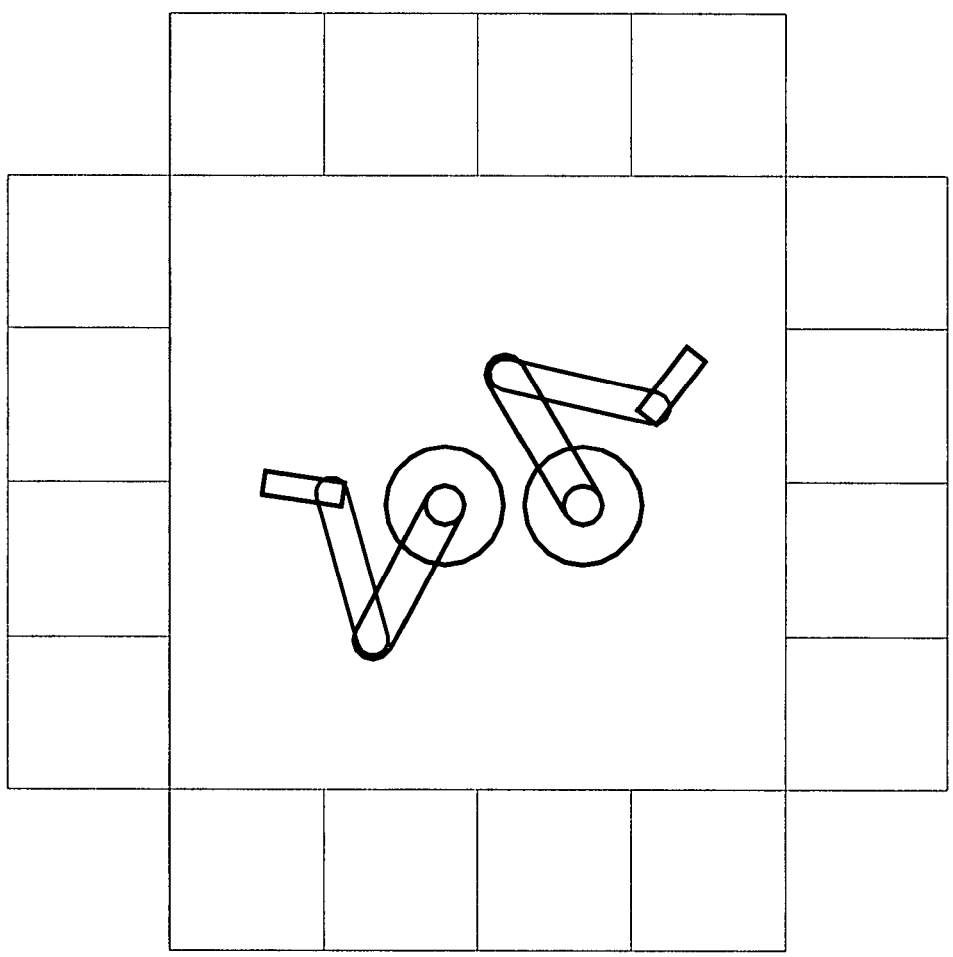
FIG. 7 shows a configuration of two robot assembly in application to linear arrays of workpiece stations.

FIGS. 6 and 7 show exemplary configurations of redundantable robot assembly for transferring workpieces. FIG. 6 shows a configuration with the stations located concentric around the robot assembly, and FIG. 7 shows a configuration with the stations located in linear arrays around the robot assembly.

Figure 8:
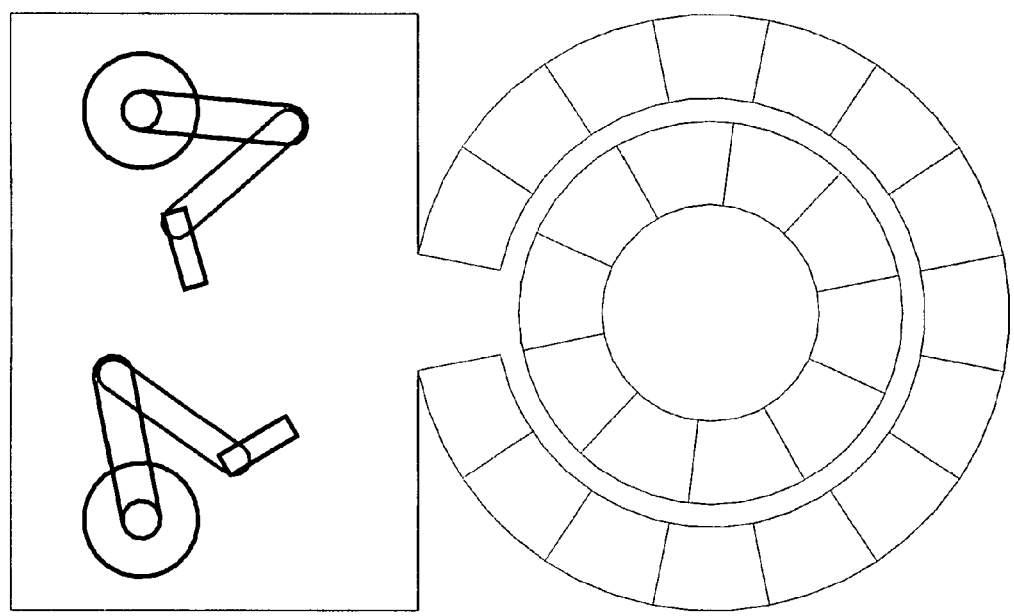
FIG. 8 shows an exemplary configuration where two robots of the redundantable robot assembly of the present invention are located facing a carousel stocker storage area.

The present invention redundantable robot assembly can be used in a stocker. An embodiment of the invention comprises a stocker storage area, comprising workpieces arranged in an array. Two redundant transfer robots are installed at a front side of the stocker array for transfer the workpieces in and out of the stocker. The stocker station can interface with the tracks in the interbay multilevel track system. Another robot assembly moves the carriers between the stocker and interbay track system. When the transfer or handling capability is insufficient with only the first transfer robot, the storage of the lots in the stocker can be performed by using the second transfer robot as well. Thus the redundantable robot assembly can improve the throughput of the equipment. The capacity of the stocker can also be designed with the capacity of the two robots. Since a plurality of transport mechanisms are used, the substrates are transported efficiently, thereby improving the overall through put of the apparatus as a whole. FIG. 8 shows an exemplary configuration where two robots of the redundantable robot assembly of the present invention are located facing a carousel stocker storage area.

Figure 9:
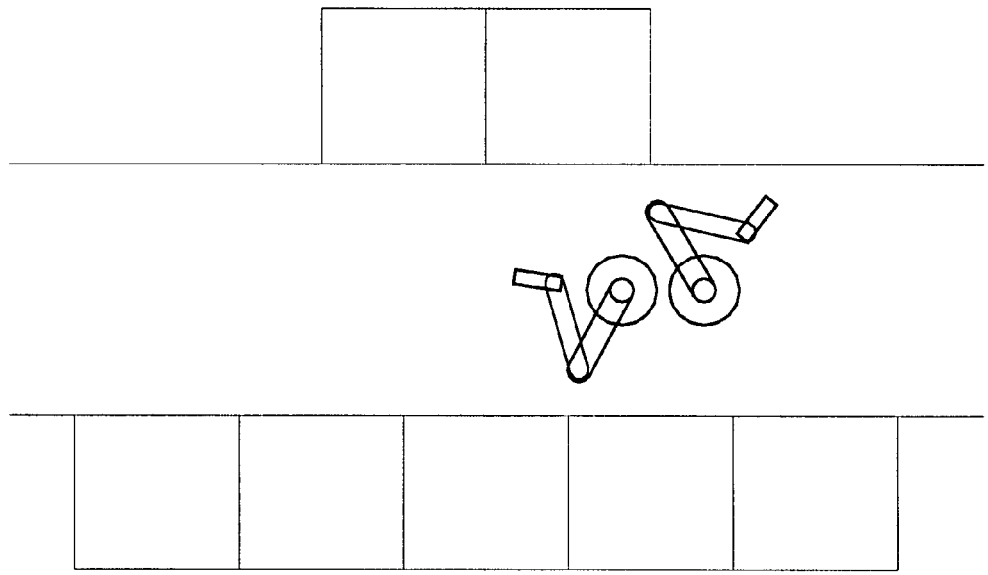
FIG. 9 shows an exemplary configuration where two robots of the redundantable robot assembly of the present invention are positioned on a linear track of front end assembly.

The robot assembly can be used, in one embodiment, in the front end assembly to transfer workpieces between cassettes in a pod assembly. The front end assembly generally contains a horizontal motion robot assembly to move a workpiece to the front end module or to the central module. FIG. 9 shows an exemplary configuration where two robots of the redundantable robot assembly of the present invention are positioned on a linear track, traveling back and forth to transfer workpieces from the front end assembly to the loadlock of the equipment.

Figure 10A:
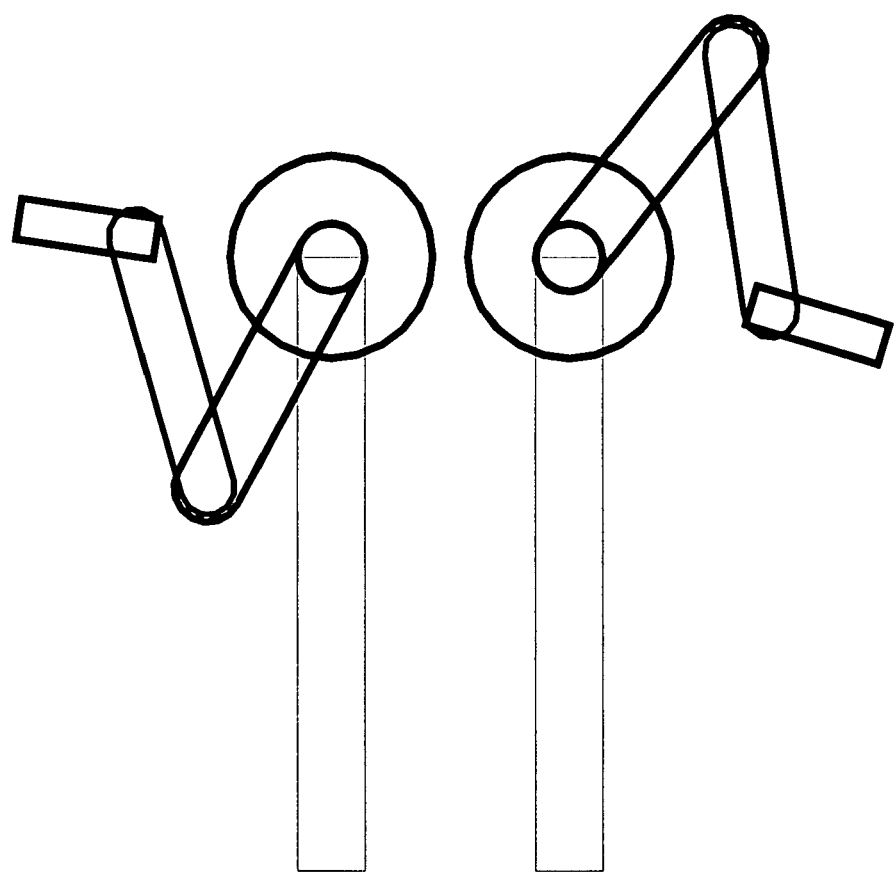
FIGS. 10A and 10B show configurations where the robots can be moved linearly for servicing.
Figure 10B:
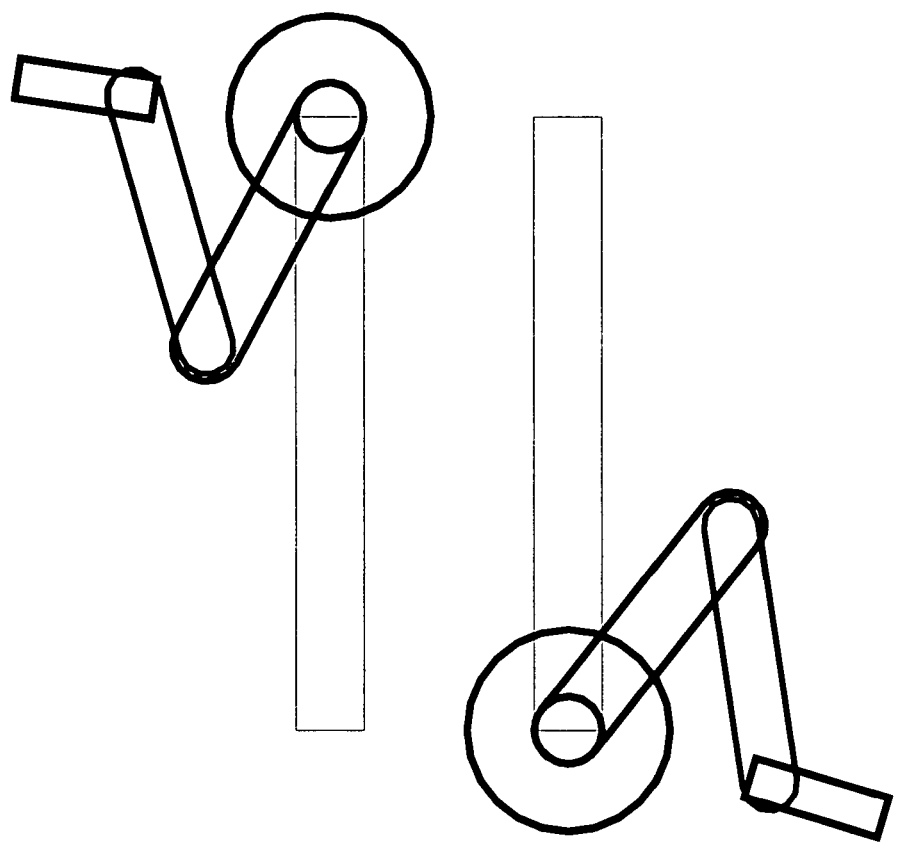

FIGS. 10A and 10B show configurations where the robots can be moved for servicing. FIG. 10A shows a configuration where the two robots are in operation mode. The robots are connected to a linear guide, where the robots can slide through the guide. FIG. 10B shows a configuration where the robot on the right is inoperative, and has been moved to a servicing station. The left robot can be still operating, and thus, moving the inoperative robot out of the way help prevent disrupting the movement of the working robot, together with providing room for servicing the inoperative robot.

Figure 11A:
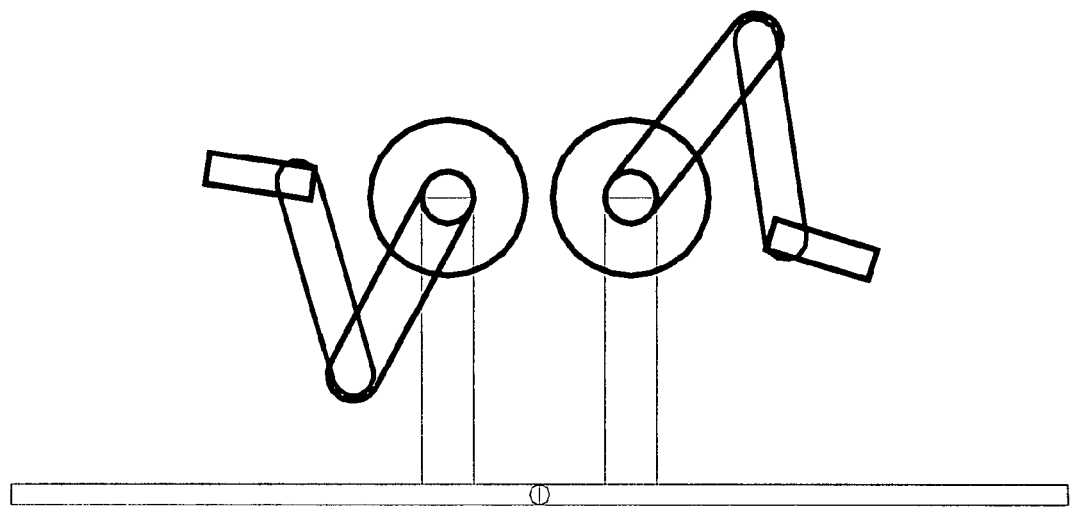
FIGS. 11A and 11B show configurations where the robots can be moved rotationally for servicing.
Figure 11B:
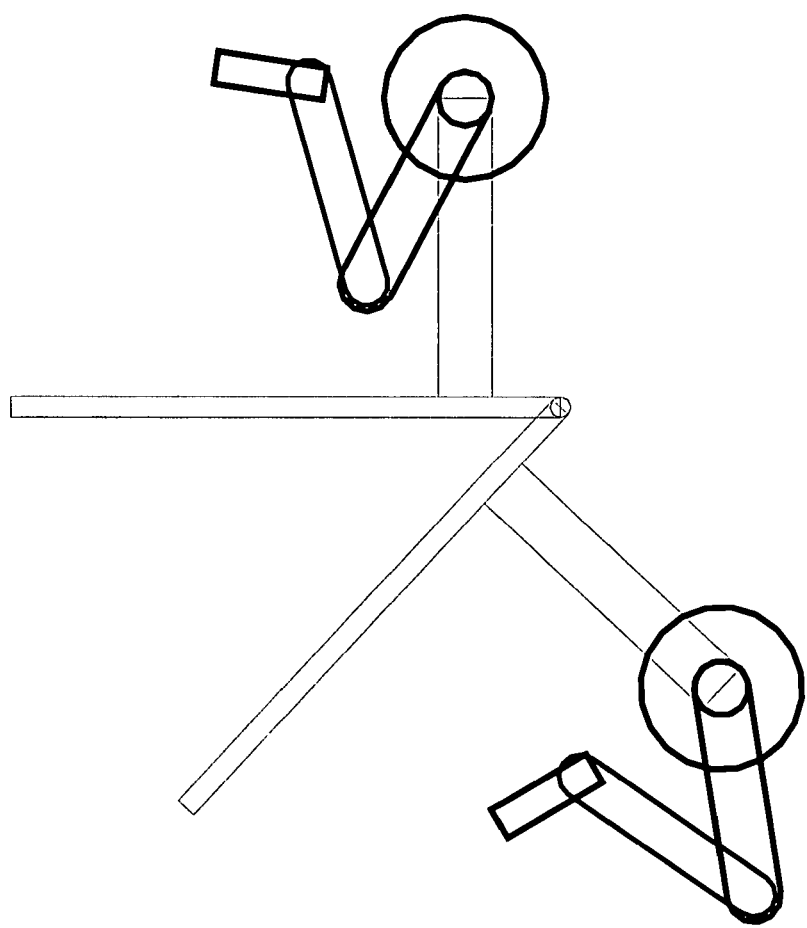

FIGS. 11A and 11B show another configuration for servicing the redundantable robot assembly. The moving section comprises a hinge door, where an inoperative robot can be moved out. FIG. 11A shows a working configuration, and FIG. 11B shows that the right robot has been moved out for servicing. Other configurations for servicing also are possible.

Figure 12A:
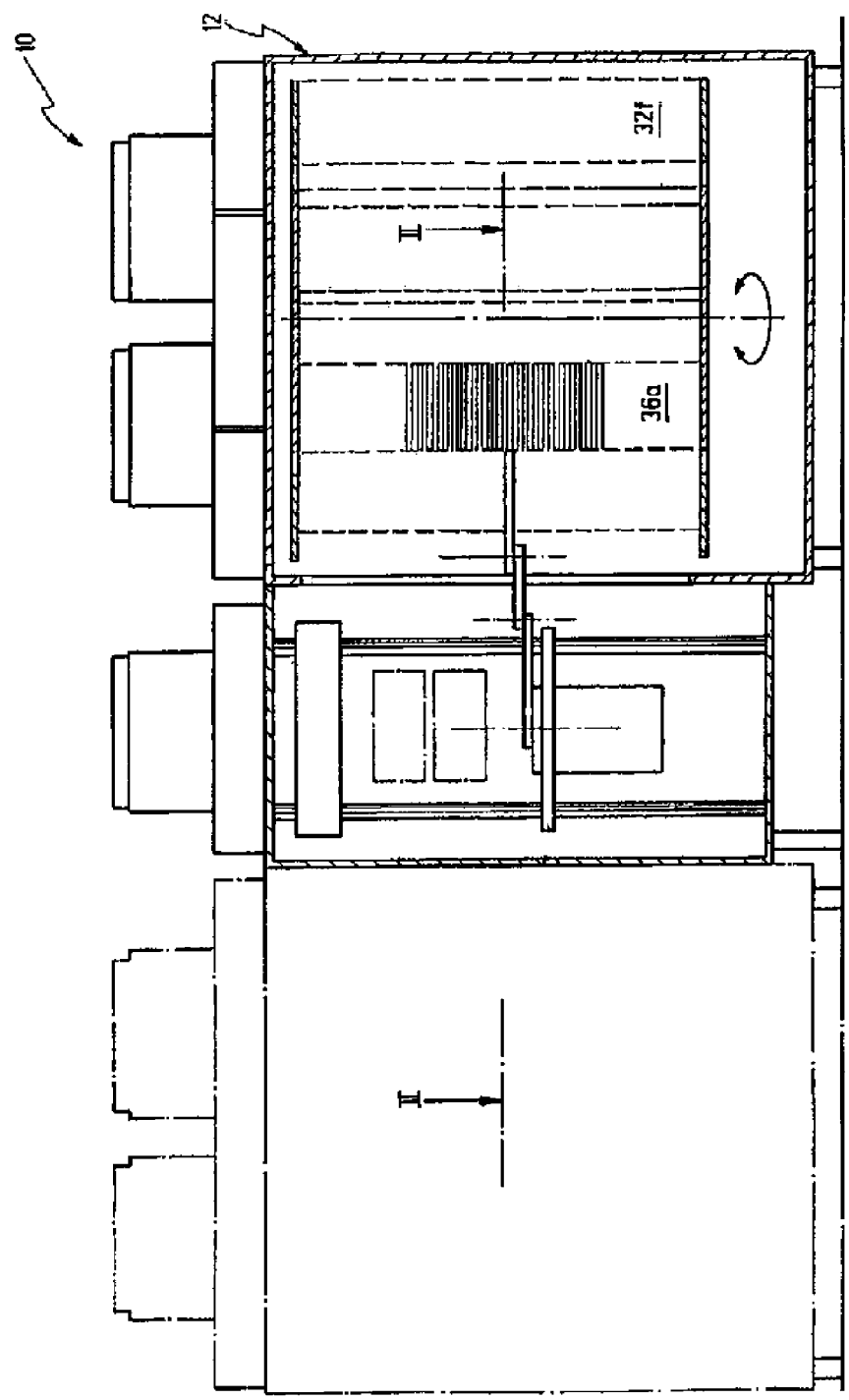
FIGS. 12A and 12B show a configuration for a stocker according to an embodiment of the present invention.
Figure 12B:
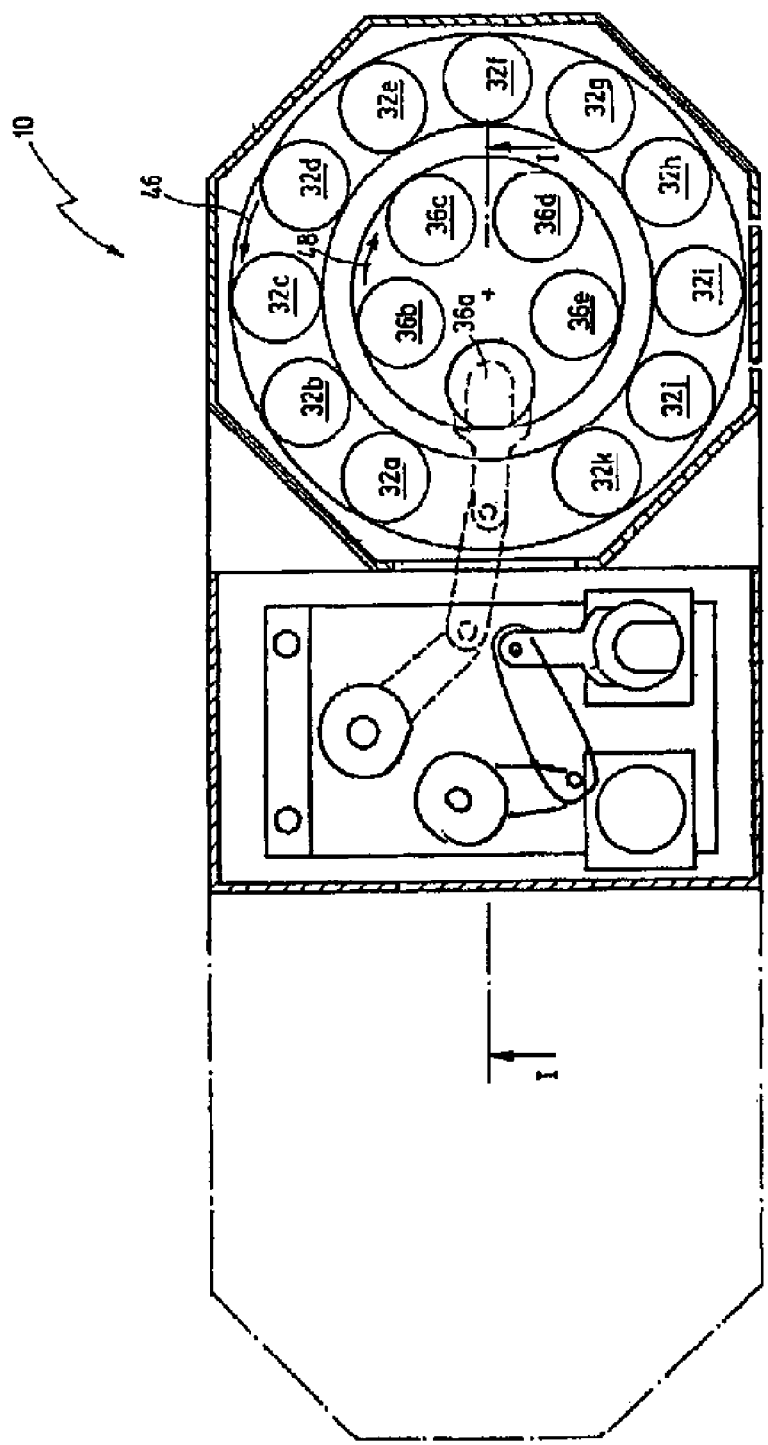

FIGS. 12A and 12B show a configuration for a stocker system. FIG. 12A shows a cross section along the cut line I-I of FIG. 12B, and FIG. 12B shows a top view of an exemplary stocker 10 along the cut line II-II of FIG. 12B, employing a redundantable robot assembly with two robots. The stocker 10 includes a stocker storage 12, which is configured to support multiple workpieces 32a, 32b, 32c, 32d, 32e, 32f, 32g, 32h, 32i, 32j, 32k, and 36a, 36b, 36c, 36d, 36e, arranged in circular configurations around an axis of rotation. The stocker storage 12 can be configured to rotate workpieces 32a-32k in direction 46, and to rotate workpieces 36a-36k in direction 48. As shown, carousel stocker storage 12 is rotated to present workpiece 36a to the robot.

The robot assembly further comprises a plurality of sensors, such as workpiece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors provides the status and locations of the robot assembly, thus allowing the optimum utilization of the remaining operative part of the assembly, plus the alerting the operator for servicing the inoperative parts of the assembly.

The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor.

Figure 13:
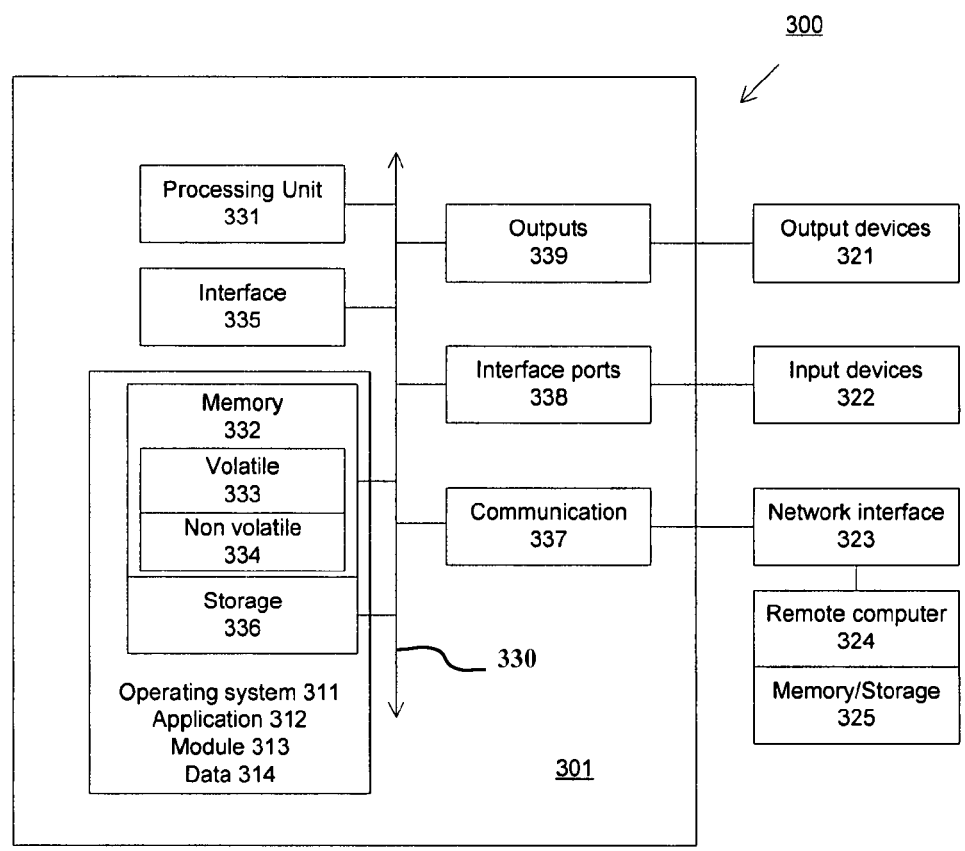
FIG. 13 shows an exemplary computer system for the present invention.

With reference to FIG. 13, an exemplary environment 300 for implementing various aspects of the invention includes a computer 301, comprising a processing unit 331, a system memory 332, and a system bus 330. The processing unit 331 can be any of various available processors, such as single microprocessor, dual microprocessors or other multiprocessor architectures. The system bus 330 can be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 332 can include volatile memory 333 and nonvolatile memory 334. Nonvolatile memory 334 can include read only memory (ROM), programmable ROM (PROM), electrically programmable ROM (EPROM), electrically erasable ROM (EEPROM), or flash memory. Volatile memory 333, can include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 301 also includes storage media 336, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 335 can be used to facilitate connection.

The computer system 301 further can include software to operate in environment 300, such as an operating system 311, system applications 312, program modules 313 and program data 314, which are stored either in system memory 332 or on disk storage 336. Various operating systems or combinations of operating systems can be used.

Input devices 322 can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 338. Interface ports 338 can include a serial port, a parallel port, a game port, a universal serial bus (USB), and a 1394 bus. The interface ports 338 can also accommodate output devices 321. For example, a USB port may be used to provide input to computer 301 and to output information from computer 301 to an output device 321. Output adapter 339, such as video or sound cards, is provided to connect to some output devices such as monitors, speakers, and printers.

Computer 301 can operate in a networked environment with remote computers 324. The remote computers 324, shown with a memory storage device 325, can be a personal computer, a server, a router, a network PC, a workstation, a microprocessor based appliance, a peer device or other common network node and the like, and typically includes many or all of the elements described relative to computer 301. Remote computers 324 can be connected to computer 301 through a network interface 323 and communication connection 337. Network interface 323 can be communication networks such as local-area networks (LAN) and wide area networks (WAN). LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Figure 14:
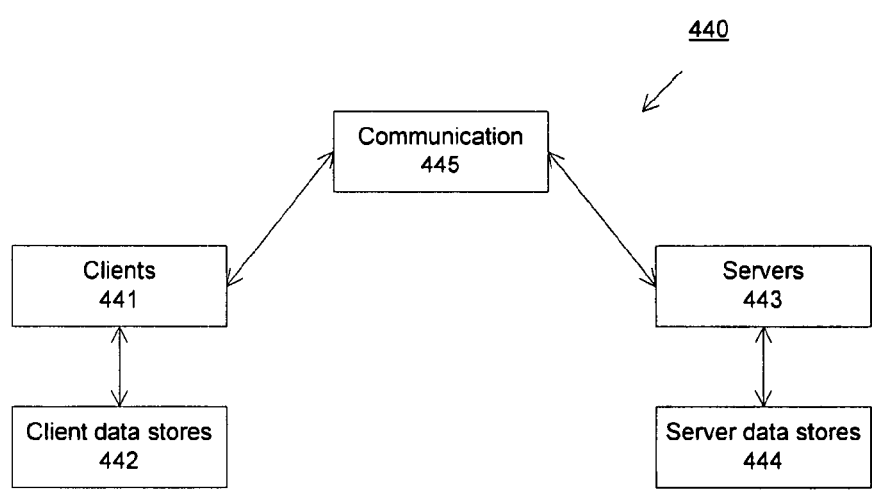
FIG. 14 shows an exemplary computer environment for the present invention.

FIG. 14 is a schematic block diagram of a sample computing system 440 with which the present invention can interact. The system 440 includes a plurality of client systems 441. The system 440 also includes a plurality of servers 443. The servers 443 can be used to employ the present invention. The system 440 includes a communication network 445 to facilitate communications between the clients 441 and the servers 443. Client data storage 442, connected to client system 441, can store information locally. Similarly, the server 443 can include server data storages 444.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

What is claimed is:

1. A method for improving reliability of an equipment having workpiece movement, the equipment comprising a redundantable workpiece transfer mechanism, the redundantable workpiece transfer mechanism comprises at least two independent workpiece transfer assemblies,
wherein each independent workpiece transfer assembly is configured to perform same workpiece transfers on a same workpiece as the other workpiece transfer assemblies, so that when a workpiece transfer assembly fails, the other workpiece transfer assemblies are capable of performing the transfer for the failed workpiece transfer assembly, wherein each independent workpiece transfer assembly is capable of transferring the workpieces regardless of the operating status of other workpiece transfer assemblies, the method comprising rotating a carousel stocker storage,
wherein the carousel stocker storage is configured to support multiple workpieces arranged in circular configurations around an axis of rotation,
wherein the carousel stocker storage is rotated to present a workpiece to the redundantable workpiece transfer mechanism, determining operatable workpiece transfer assemblies, and allocating the movement of the workpieces to the operatable workpiece transfer assemblies,
wherein allocating to the operatable workpiece transfer assemblies comprises re-assigning workpieces that are assigned to an inoperative workpiece transfer assembly, and
wherein allocating to the operatable workpiece transfer assemblies comprises re-assigning the movement of the workpieces to a just-become-operating workpiece transfer assembly.

2. A method as in claim 1 further comprising sensors for determining the inoperative state of the workpiece transfer assemblies.

3. A method as in claim 1
wherein the workpiece transfer assemblies have a substantially overlapping capability of transferring the workpieces, and
wherein non-overlapping workpieces are not re-assignable.

4. A method as in claim 1 wherein allocating workpiece movement comprises bypassing an inoperative transfer assembly.

5. A method as in claim 1 further comprising
moving the non-operatable independent workpiece transfer assembly to allow repair while the others are operating.

6. A method as in claim 1 further comprising
establishing a service zone around the workpiece transfer assembly for safe servicing an inoperative workpiece transfer assembly while other workpiece transfer assemblies still operating.

7. A method as in claim 1 further comprising
ejecting an inoperative workpiece transfer assembly to a serviceable area.

8. A method comprising
rotating a carousel stocker storage,
wherein the carousel stocker storage is configured to support multiple workpieces arranged in circular configurations around an axis of rotation,
wherein the carousel stocker storage is rotated to present a workpiece to the redundantable workpiece transfer mechanism, transferring the workpiece using the redundantable workpiece transfer mechanism,
wherein the redundantable workpiece transfer mechanism comprises at least two independent workpiece transfer assemblies,
wherein each independent workpiece transfer assembly is configured to perform a same workpiece transfer operation on a same workpiece as the other workpiece transfer assemblies, so that when a workpiece transfer assembly fails, the other workpiece transfer assemblies are capable of performing the transfer for the failed workpiece transfer assembly,
wherein each independent workpiece transfer assembly is capable of transferring the workpieces regardless of the operating status of other workpiece transfer assemblies,
wherein the redundantable workpiece transfer mechanism is configured to allow in-situ servicing an independent workpiece transfer assembly while other independent workpiece transfer assemblies are still operational.

9. A method as in claim 8 further comprising
ejecting an inoperative workpiece transfer assembly to a serviceable area.

10. A method as in claim 9 wherein ejecting comprises sliding the transfer assembly to a serviceable area.

11. A method as in claim 9 wherein ejecting comprises coupling the transfer assembly to a hinged door, wherein the hinged door is operable to move the inoperative workpiece transfer assembly to a serviceable area.

12. A method as in claim 8 further comprising
coordinating the transferring of the workpieces between the independent workpiece transfer assemblies,
wherein coordinating comprises recognizing the operating status of the workpiece transfer assemblies and
wherein coordinating comprises assigning the transferring of the workpieces to operating workpiece transfer assemblies.

13. A method as in claim 8 wherein each independent workpiece transfer assembly comprises a 6-axis robot.

14. A method as in claim 8 wherein the redundantable workpiece transfer mechanism comprises two robots facing a carousel stocker storage.

\* \* \* \* \*